(12) United States Patent
Umeda et al.

(10) Patent No.: US 12,016,165 B2
(45) Date of Patent: Jun. 18, 2024

(54) SHIELD PACKAGE

(71) Applicant: Tatsuta Electric Wire & Cable Co., Ltd., Osaka (JP)

(72) Inventors: Hiroaki Umeda, Kizugawa (JP); Hidetoshi Noguchi, Kizugawa (JP); Hajime Nakazono, Kizugawa (JP); Sougo Ishioka, Kizugawa (JP)

(73) Assignee: Tatsuta Electric Wire & Cable Co., Ltd., Osaka (JP)

( * ) Notice: Subject to any disclaimer, the term of this patent is extended or adjusted under 35 U.S.C. 154(b) by 565 days.

(21) Appl. No.: 17/295,975

(22) PCT Filed: Nov. 19, 2019

(86) PCT No.: PCT/JP2019/045237
§ 371 (c)(1),
(2) Date: May 21, 2021

(87) PCT Pub. No.: WO2020/105622
PCT Pub. Date: May 28, 2020

(65) Prior Publication Data
US 2022/0030751 A1   Jan. 27, 2022

(30) Foreign Application Priority Data
Nov. 21, 2018  (JP) ............................. 2018-218409

(51) Int. Cl.
*H05K 9/00*   (2006.01)
*G06K 19/06*  (2006.01)
*H01L 23/552* (2006.01)

(52) U.S. Cl.
CPC ....... *H05K 9/003* (2013.01); *G06K 19/06037* (2013.01); *H01L 23/552* (2013.01); *H05K 9/0081* (2013.01); *H01L 2223/54413* (2013.01)

(58) Field of Classification Search
CPC .................... H01L 23/552; H01L 2223/54413
See application file for complete search history.

(56) References Cited

U.S. PATENT DOCUMENTS 11,510,349  B2 *  11/2022  Umeda ................ H01L 23/544
2012/0015687 A1    1/2012  Yamada et al.
(Continued)

FOREIGN PATENT DOCUMENTS

CN    102790019 A    11/2012
JP    H03124051 A    5/1991
(Continued)

OTHER PUBLICATIONS

International Search Report dated Feb. 10, 2020, issued in International Application No. PCT/JP2019/045237.
(Continued)

*Primary Examiner* — Hung V Ngo
(74) *Attorney, Agent, or Firm* — United IP Counselors, LLC; Kenneth M. Fagin

(57) ABSTRACT

The present invention aims to provide a shield package having a highly distinctive patterned portion formed on a surface of a shield layer. The shield package of the present invention includes a package in which an electronic component is sealed with a sealing material, and a shield layer covering the package, wherein a surface of the shield layer includes a patterned portion and a non-patterned portion other than the patterned portion, and a ratio of Sal (autocorrelation length) of the non-patterned portion to Sal of the patterned portion is as follows: (Sal of non-patterned portion)/(Sal of patterned portion)>4.0.

12 Claims, 8 Drawing Sheets

(56) References Cited

U.S. PATENT DOCUMENTS

| | | | |
|---|---|---|---|
| 2012/0290117 A1* | 11/2012 | Wang | H01L 23/544 |
| | | | 700/286 |
| 2012/0295668 A1 | 11/2012 | Kitahara et al. | |
| 2014/0284775 A1* | 9/2014 | Nomura | H01L 24/85 |
| | | | 257/659 |
| 2015/0214076 A1 | 7/2015 | Kitahara et al. | |
| 2016/0276290 A1 | 9/2016 | Yamada et al. | |
| 2017/0243831 A1* | 8/2017 | Butler | H01L 23/544 |
| 2018/0069710 A1* | 3/2018 | De Langen | H04L 9/14 |
| 2020/0299524 A1 | 9/2020 | Umeda et al. | |

FOREIGN PATENT DOCUMENTS

| | | |
|---|---|---|
| JP | 10613475 A | 1/1994 |
| JP | 2000334785 A | 12/2000 |
| JP | 2001118945 A | 4/2001 |
| JP | 2015015498 A | 1/2015 |
| JP | 2015233164 A | 12/2015 |
| JP | 2018195756 A | 12/2018 |
| WO | 2015186624 A1 | 12/2015 |
| WO | 2016181706 A1 | 11/2016 |
| WO | 2017170390 A1 | 10/2017 |

OTHER PUBLICATIONS

Written Opinion dated Feb. 10, 2020, issued in International Application No. PCT/JP2019/045237.

* cited by examiner

FIG.1
(a)
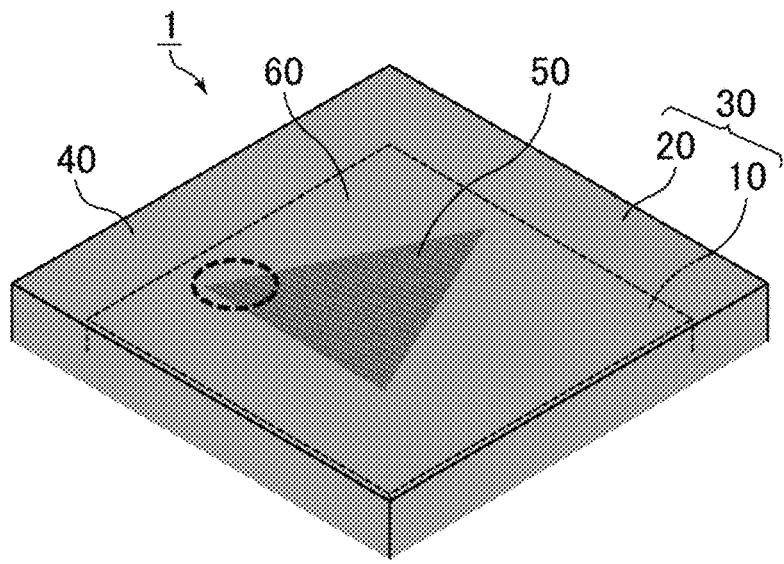
(b)
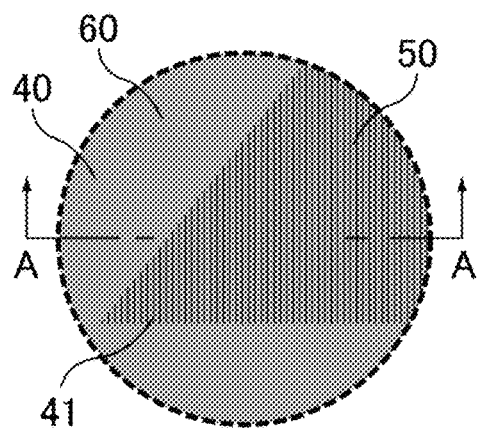
(c)
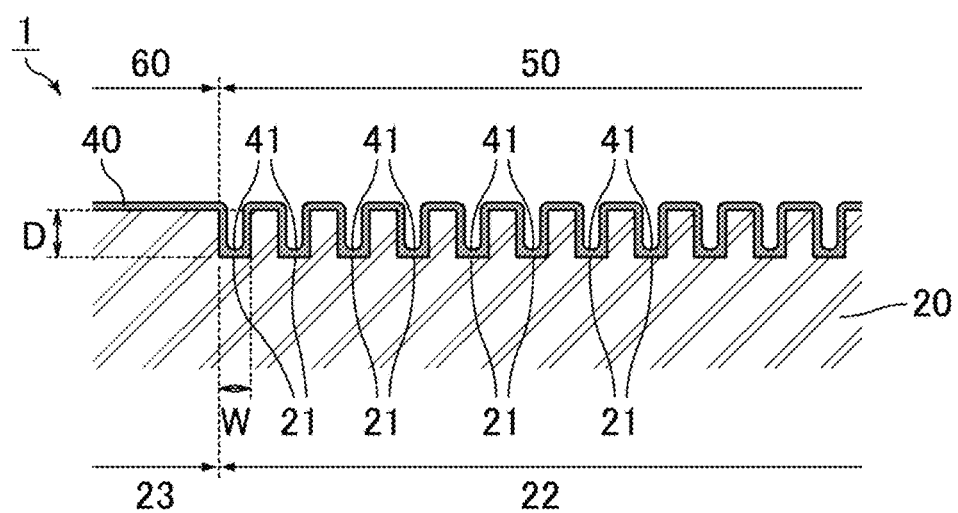

FIG.2
(a)
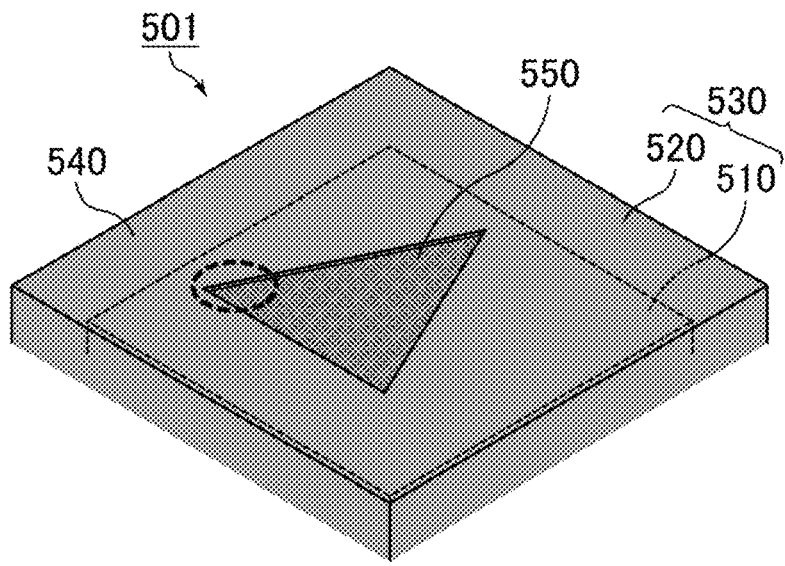
(b)
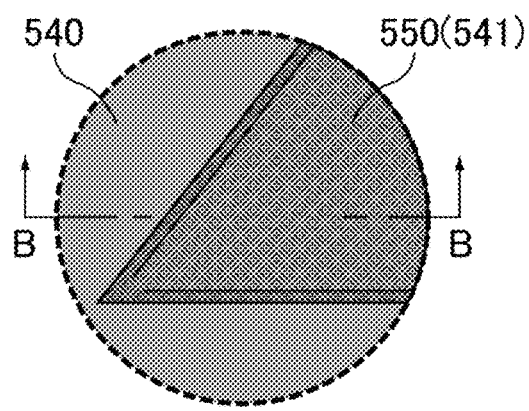
(c)
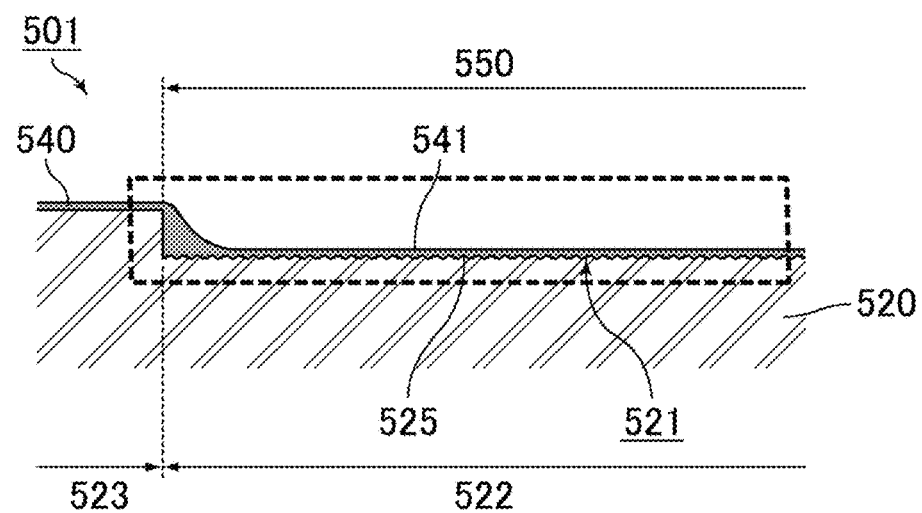

FIG.3
(a)
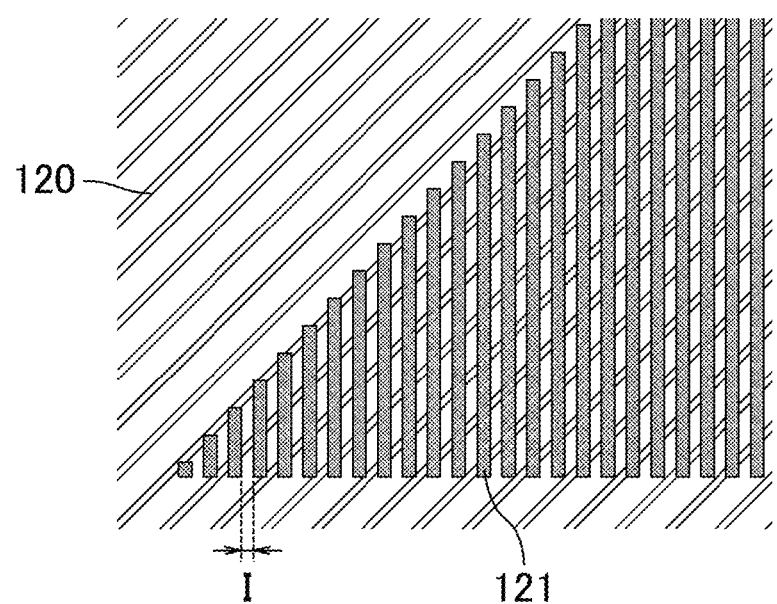
(b)
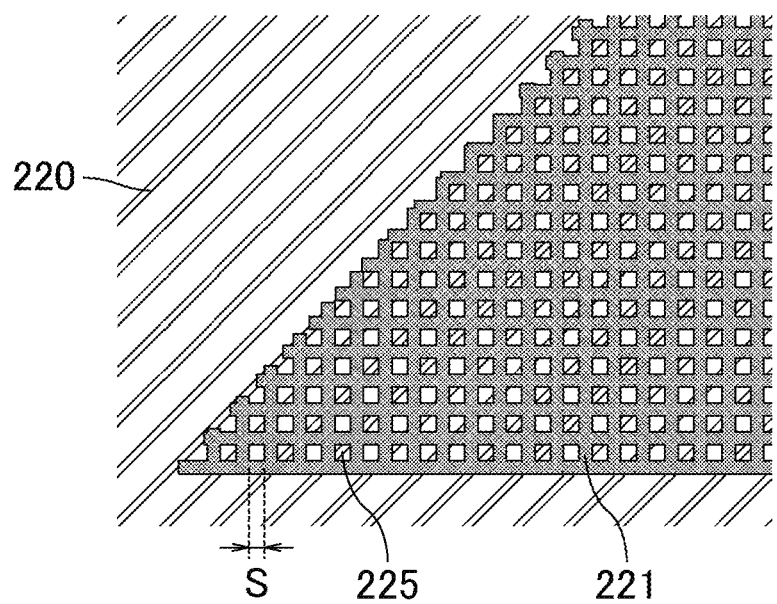

FIG.8
(a)
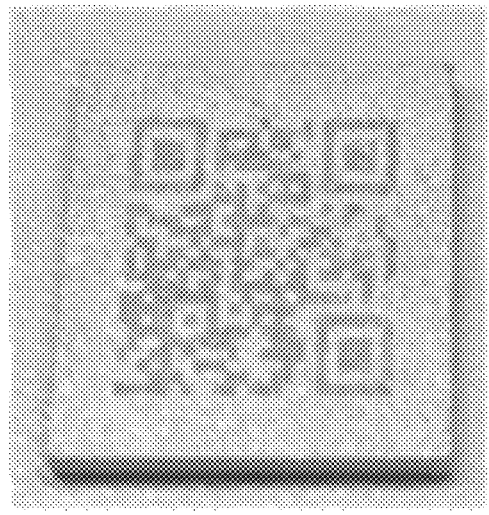
(b)
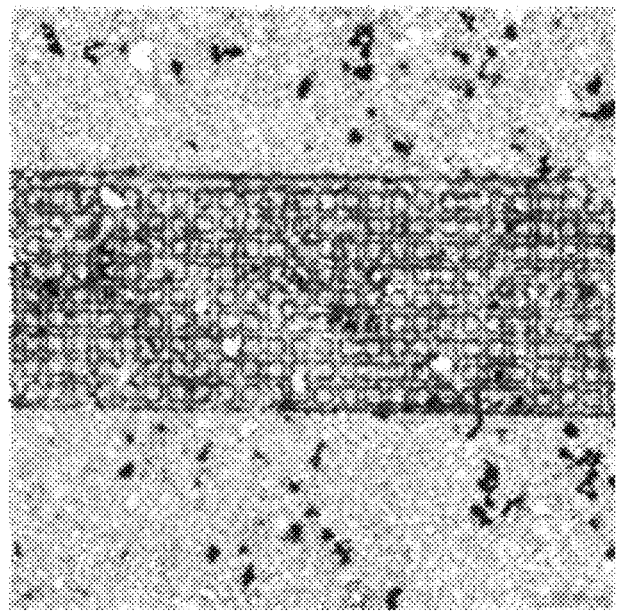

SHIELD PACKAGE

TECHNICAL FIELD

The present invention relates to a shield package and a method of producing a shield package.

BACKGROUND ART

Nowadays, electronic devices such as mobile phones and tablet terminals include many electronic components mounted thereon for wireless communication to transmit a large amount of data. These electronic components are provided as a package sealed with a sealing material.

Such electronic components for wireless communication are not only likely to generate noise but are also sensitive to noise, and are thus likely to cause a malfunction when exposed to external noise.

There is a demand to increase the mounting density of electronic components in order to provide smaller and lighter electronic devices with higher functionality. Yet, an increase in mounting density not only increases the number of electronic components that cause noise but also increases the number of electronic components affected by noise.

Conventionally known techniques include a shield package in which a whole package containing an electronic component that causes noise is covered with a shield layer to prevent generation of noise from the electronic component and to prevent intrusion of noise (Patent Literatures 1 and 2).

In addition, in order to improve the distinctiveness of a package in which an electronic component is sealed with a sealing material, a method of laser marking a surface of the package has been conventionally employed (Patent Literature 3).

CITATION LIST

Patent Literature

Patent Literature 1: WO 2017/170390
Patent Literature 2: WO 2015/186624
Patent Literature 3: JP H03-124051 A

SUMMARY OF INVENTION

Technical Problem

An example method of improving the distinctiveness of a shield package is as follows.

First, a laser beam is applied to a sealing material of a package to etch a surface of the sealing material, whereby a groove is formed. Due to the laser etching, fine irregularities are formed on a bottom of the groove in the surface of the sealing material.

Next, a metal thin film is deposited on the sealing material by sputtering to form a shield layer. The shield layer has irregularities originating from the fine irregularities on the surface of the sealing material, whereby a distinctive patterned portion is formed.

The shield layer formed by sputtering has irregularities originating from the fine irregularities on the surface of the sealing material, and a patterned portion is formed with these irregularities. Thus, the boundary of the patterned portion is easily discernible. The shield layer formed by sputtering, however, shows poor reliability in a heat cycle test because the coefficient of linear expansion is different between the sealing material sealing an electronic component and the metal thin film. Further, the productivity is not sufficient because sputtering devices are expensive.

In addition, when a conductive coating material is applied to the surface of the sealing material by spraying, a leveling effect of the conductive coating material smooths the shield layer formed on fine irregularities of the grooves in the sealing material. As a result, the boundary of a portion to which the laser was applied may not be easily discernible, and the boundary of the distinctive patterned portion may be unclear.

The present invention was made to solve the above problems and aims to provide a shield package including a highly distinctive patterned portion formed on a surface of a shield layer.

Solution to Problem

A shield package of the present invention includes a shield layer, a patterned portion, and a non-patterned portion other than the patterned portion, the patterned portion and the non-patterned portion being provided on a surface of the shield layer.

In the shield package of the present invention, the ratio of a specific parameter representing the shape of the non-patterned portion to the specific parameter representing the shape of the patterned portion satisfies a predetermined relation. This creates a difference in reflectance between the non-patterned portion and the patterned portion, resulting in a large difference in brightness between the patterned portion and the non-patterned portion other than the patterned portion. Thus, the patterned portion has a clear boundary. As a result, in the shield package of the present invention, the patterned portion is highly distinctive.

The term "patterned portion" as used herein encompasses not only simple patterns such as circles and triangles but also those that indicate distinctive information such as letters and marks.

The phrase "those that indicate distinctive information" encompasses not only those that are visually distinguishable but also those that are distinguishable by optical means such as readers.

The shield package of the present invention is a shield package including a package in which an electronic component is sealed with a sealing material, and a shield layer covering the package, wherein a surface of the shield layer includes a patterned portion and a non-patterned portion other than the patterned portion, and a ratio of Sal (auto-correlation length) of the non-patterned portion to Sal of the patterned portion is as follows: (Sal of non-patterned portion)/(Sal of patterned portion)>4.0.

In the shield package of the present invention, the auto-correlation length, i.e., Sal, is used as the specific parameter representing the shape of the non-patterned portion and the specific parameter representing the shape of the patterned portion.

When the Sal ratio is in the above range, the patterned portion includes a larger number of sharp irregularities than the non-patterned portion. Presumably, this prevents or reduces reflection of light. Thus, the light and dark contrast between the patterned portion and the non-patterned portion is clear, further improving the distinctiveness of the patterned portion.

Another shield package of the present invention is a shield package including a package in which an electronic component is sealed with a sealing material, and a shield layer covering the package, wherein a surface of the shield layer includes a patterned portion and a non-patterned portion other than the patterned portion, and a ratio of Smr1 (areal material ratio that divides reduced peaks from a core surface) of the non-patterned portion to Smr1 of the patterned portion is as follows: (Smr1 of non-patterned portion)/(Smr1 of patterned portion)>1.0.

In the another shield package of the present invention, the areal material ratio that divides the reduced peaks from the core surface, i.e., Smr1, is used as the specific parameter representing the shape of the non-patterned portion and the specific parameter representing the shape of the patterned portion.

When the Smr1 ratio is in the above range, the patterned portion includes a larger number of sharp irregularities than the non-patterned portion. Presumably, this prevents or reduces reflection of light. Thus, the light and dark contrast between the patterned portion and the non-patterned portion is clear, further improving the distinctiveness of the patterned portion.

A still another shield package of the present invention is a shield package including a package in which an electronic component is sealed with a sealing material, and a shield layer covering the package, wherein a surface of the shield layer includes a patterned portion and a non-patterned portion other than the patterned portion, and a ratio of Ssk (skewness) of the non-patterned portion to Ssk of the patterned portion is as follows: (Ssk of non-patterned portion)/(Ssk of patterned portion)<5.0.

In the still another shield package of the present invention, the skewness, i.e., Ssk, is used as the specific parameter representing the shape of the non-patterned portion and the specific parameter representing the shape of the patterned portion.

When the Ssk ratio is in the above range, the patterned portion includes a larger number of fine protrusions than the non-patterned portion. Presumably, this prevents or reduces reflection of light. Thus, the light and dark contrast between the patterned portion and the non-patterned portion is clear, further improving the distinctiveness of the patterned portion.

A yet still another shield package of the present invention is a shield package including a package in which an electronic component is sealed with a sealing material, and a shield layer covering the package, wherein a surface of the shield layer includes a patterned portion and a non-patterned portion other than the patterned portion, and a ratio of Rvk (reduced valley depth) of the non-patterned portion to Rvk of the patterned portion is as follows: (Rvk of non-patterned portion)/(Rvk of patterned portion)<0.4.

In the yet still another shield package of the present invention, the reduced valley depth, i.e., Rvk, is used as the specific parameter representing the shape of the non-patterned portion and the specific parameter representing the shape of the patterned portion.

When the Rvk ratio is in the above range, valleys on the surface of the patterned portion are sufficiently deeper than valleys on the surface of the non-patterned portion. Presumably, this prevents or reduces reflection of light. Thus, the light and dark contrast between the patterned portion and the non-patterned portion is clear, further improving the distinctiveness of the patterned portion.

In the shield package of the present invention, a surface of the sealing material includes a drawing area drawn with lines and/or dots by aggregation of multiple grooves, and a non-drawing area other than the drawing area; and multiple depressions originating from the grooves are formed on a surface of the shield layer on the drawing area. The depressions may be aggregated to draw the patterned portion with lines and/or dots.

The formation of the grooves on the surface of the sealing material facilitates formation of the patterned portion on the surface of the shield layer.

Since the patterned portion is formed with lines and/or dots, the patterned portion has good distinctiveness.

In the shield package of the present invention, at least some of the multiple grooves may each have a line shape.

Line-shaped grooves are easily formed by laser marking.

In the shield package of the present invention, preferably, at least some of the multiple grooves are formed linearly and in parallel to each other.

Linear and parallel grooves are simple shapes so that they can be efficiently formed.

In the shield package of the present invention, preferably, the grooves adjacent to each other are arranged at an interval of 10 to 100 μm.

When each interval between adjacent grooves is in the above range, the difference in brightness is clearer between the patterned portion drawn with lines on the surface of the shield layer and the non-patterned portion.

When each interval between adjacent grooves is less than 10 μm, it takes time to form the grooves and it is inefficient. In addition, the leveling effect of the conductive coating material makes the patterned portion less recognizable by optical means such as a reader.

When each interval between adjacent grooves is more than 100 μm, the intervals between the depressions formed on the surface of the shield layer are large, and there are fewer depressions per unit area. Thus, there are fewer depressions to draw the patterned portion.

As a result, the difference in brightness is small between the patterned portion on the surface of the shield layer and the non-patterned portion, making the patterned portion less distinguishable.

In the shield package of the present invention, at least some of the multiple grooves may be formed in a grid shape.

The grid-shaped grooves can be easily formed by laser marking crosswise.

In the shield package of the present invention, preferably, each cell of the grid formed by the grooves has a width of 10 to 100 μm.

When the width of each cell of the grid formed by the grooves is in the above range, the difference in brightness is clear between the patterned portion drawn with lines on the surface of the shield layer and the non-patterned portion.

When the width of each cell of the grid formed by the grooves is less than 10 μm, it takes time to form the grooves and it is inefficient. In addition, the leveling effect of the conductive coating material makes the patterned portion less recognizable by optical means such as a reader.

When the width of each cell of the grid formed by the grooves is more than 100 μm, the intervals of the depressions formed on the surface of the shield layer are large, and there are fewer depressions per unit area. Thus, there are fewer depressions to draw the patterned portion.

As a result, the difference in brightness is small between the patterned portion on the surface of the shield layer and the non-patterned portion, making the patterned portion less distinguishable.

In the shield package of the present invention, preferably, each groove has a width of 5 to 100 μm.

When the width of each groove is in the above range, the difference in brightness is clear between the patterned portion drawn with lines and/or dots on the surface of the shield layer and the non-patterned portion.

When the width of each groove is less than 5 µm, the depressions are less likely to be formed on the surface of the shield layer. As a result, the difference in brightness is small between the patterned portion on the surface of the shield layer and the non-patterned portion, making the patterned portion less distinguishable. In addition, the leveling effect of the conductive coating material makes the patterned portion less recognizable by optical means such as a reader.

When the width of each groove is more than 100 µm, the width of each depression formed on the surface of the shield layer is large, and there are fewer depressions per unit area. Thus, there are fewer depressions to draw the patterned portion.

As a result, the difference in brightness is small between the patterned portion on the surface of the shield layer and the non-patterned portion, making the patterned portion less distinguishable.

In the shield package of the present invention, preferably, each groove has a depth of 5 µm or more.

When the depth of each groove is more than 5 µm or more, the depressions are clearly formed on the surface of the shield layer. Thus, the difference in brightness is clear between the patterned portion drawn with lines and/or dots on the surface of the shield layer and the non-patterned other portion.

In the shield package of the present invention, preferably, the shield layer has a thickness of 3 to 15 µm.

When the thickness of the shield layer is less than 3 µm, the shielding performance tends to be insufficient.

When the thickness of the shield layer is more than 15 µm, the distance between the grooves and the surface of the shield layer is large so that the depressions are less likely to be formed.

As a result, the difference in brightness is small between the patterned portion on the surface of the shield layer and the non-patterned portion, making the patterned portion less distinguishable.

In the shield package of the present invention, preferably, the patterned portion is a two-dimensional code.

As described above, in the shield package of the present invention, the patterned portion is highly distinctive. Thus, even when the patterned portion is a two-dimensional code, it can be easily read with optical means such as a reader.

Advantageous Effects of Invention

In the shield package of the present invention, the ratio of Sal of the non-patterned portion to Sal of the patterned portion is as follows: (Sal of the non-patterned portion)/(Sal of the patterned portion)>4.0.

When the Sal ratio is in the above range, the patterned portion includes a larger number of sharp irregularities than the non-patterned portion. Presumably, this prevents or reduces reflection of light. Thus, the light and dark contrast between the patterned portion and the non-patterned portion is clear, further improving the distinctiveness of the patterned portion.

In another shield package of the present invention, the ratio of Smr1 of the non-patterned portion to Smr1 of the patterned portion is as follows: (Smr1 of non-patterned portion)/(Smr1 of patterned portion)>1.0.

When the Smr1 ratio is in the above range, the patterned portion includes a larger number of sharp irregularities than the non-patterned portion. Presumably, this prevents or reduces reflection of light. Thus, the light and dark between the patterned portion and the non-patterned portion is clear, further improving the distinctiveness of the patterned portion.

In still another shield package of the present invention, the ratio of Ssk of the non-patterned portion to Ssk of the patterned portion is as follows: (Ssk of non-patterned portion)/(Ssk of patterned portion)<5.0.

When the Ssk ratio is in the above range, the patterned portion includes a larger number of fine protrusions than the non-patterned portion. Presumably, this prevents or reduces reflection of light. Thus, the light and dark contrast between the patterned portion and the non-patterned portion is clear, further improving the distinctiveness of the patterned portion.

In yet still another shield package of the present invention, the ratio of Rvk of the non-patterned portion to Rvk of the patterned portion is as follows: (Rvk of the non-patterned portion)/(Rvk of the patterned portion)<0.4.

When the Rvk ratio is in the above range, valleys on the surface of the patterned portion are sufficiently deeper than valleys on the surface of the non-patterned portion. Presumably, this prevents or reduces reflection of light. Thus, the light and dark contrast between the patterned portion and the non-patterned portion is clear, further improving the distinctiveness of the patterned portion.

BRIEF DESCRIPTION OF DRAWINGS

FIG. 1(a) is a perspective view schematically showing an example of a shield package of the present invention. FIG. 1(b) is an enlarged view of a portion surrounded by the dashed line in FIG. 1(a). FIG. 1(c) is a cross-sectional view taken along a line A-A in FIG. 1(b).

FIG. 2(a) is a perspective view schematically showing an example of a shield package of a comparative technique in which a single patterned portion is drawn on a shield layer with a single depression. FIG. 2(b) is an enlarged view of a portion surrounded by a dashed line in FIG. 2(a). FIG. 2(c) is a cross-sectional view taken along a line B-B in FIG. 2(b).

FIGS. 3(a) and 3(b) are top views each schematically showing an example of the shape of grooves formed in a sealing material of the shield package of the present invention.

FIG. 8(a) is a photograph of a shield package according to Embodiment 1. FIG. 8(b) is an enlarged photograph of a patterned portion of the shield package shown in FIG. 8(a).

DESCRIPTION OF EMBODIMENTS

Figure 4:
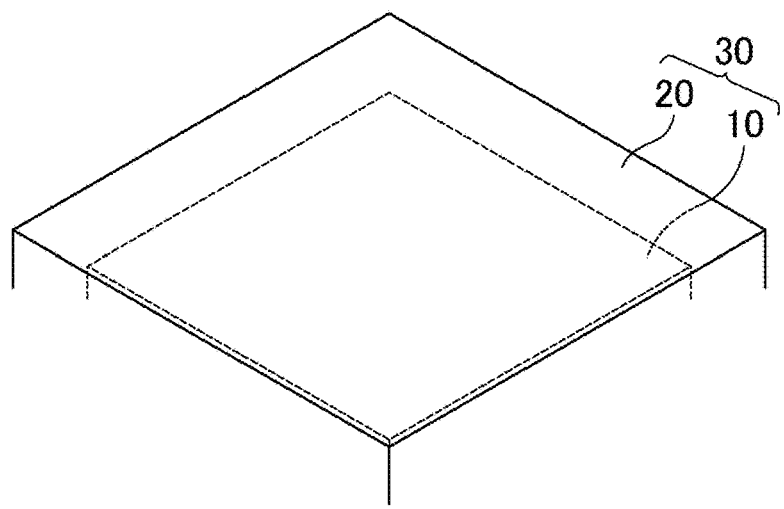
FIG. 4 is a view schematically showing an example of a package preparing step of a method of producing a shield package of the present invention.

A shield package of the present invention is specifically described below. Yet, the present invention is not limited to the following embodiments, and changes and modifications may be made without departing from the gist of the present invention.

First Embodiment

An aspect of the shield package of the present invention is described below with reference to the drawings.

FIG. 1(a) is a perspective view schematically showing an example of the shield package of the present invention. FIG. 1(b) is an enlarged view of a portion surrounded by a dashed line in FIG. 1(a). FIG. 1(c) is a cross-sectional view taken along a line A-A in FIG. 1(b).

As shown in FIG. 1(a), a shield package 1 includes a package 30 in which an electronic component 10 is sealed with a sealing material 20, and a shield layer 40 covering the package 30.

A patterned portion 50 and a non-patterned portion 60 are provided on the shield layer 40.

As shown in FIG. 1(b), the patterned portion 50 is drawn with lines by aggregation of depressions 41 formed on a surface of the shield layer 40.

As shown in FIG. 1(c), a surface of the sealing material 20 includes a drawing area 22 drawn with lines by aggregation of multiple grooves 21, and a non-drawing area 23 other than the drawing area 22.

The depressions 41 originating from the grooves 21 are formed on the surface of the shield layer 40 on the drawing area 22.

Here, a description is given on a shield package of a comparative technique in which a drawing area is formed with a single groove on a sealing material, and a shield layer is formed on the sealing material to form a depression so as to draw a single patterned portion with the single depression.

FIG. 2(a) is a perspective view schematically showing an example of the shield package of a comparative technique in which a single patterned portion is drawn on the shield layer with a single depression. FIG. 2(b) is an enlarged view of a portion surrounded by a dashed line in FIG. 2(a). FIG. 2(c) is a cross-sectional view taken along a line B-B in FIG. 2(b).

As shown in FIG. 2(a), a shield package 501 includes a package 530 in which an electronic component 510 is sealed with a sealing material 520, and a shield layer 540 covering the package 530.

A patterned portion 550 is formed on the shield layer 540.

As shown in FIG. 2(b), the patterned portion 550 is formed with a single depression 541 formed on a surface of the shield layer 540.

As shown in FIG. 2(c), a groove 521 is formed in the sealing material 520, and a drawing area 522 is formed with the single groove 521. The rest is a non-drawing area 523.

The single groove 521 is formed by laser etching.

The single groove 521 has a bottom with fine irregularities 525 due to laser etching.

In addition, a single depression 541 originating from the groove 521 is formed on the surface of the shield layer 540 on the drawing area 522.

When producing the shield package 501 as described above, the groove 521 is first formed in the sealing material 520, and a conductive coating material is then applied to form the shield layer 540.

As shown in a portion surrounded by the dashed line in FIG. 2(c), the shield layer 540 formed on the fine irregularities 525 is made smooth by the leveling effect of the conductive coating material. As a result, the boundary of the depression 541 is not easily discernible, and the boundary of the patterned portion 550 is unclear.

In contrast, in the case of the shield package 1, the patterned portion 50 is drawn with lines on the surface of the shield layer 40 by aggregation of the multiple depressions 41.

The difference in brightness is large between the patterned portion 50 drawn with lines and the non-patterned portion 60 due to the difference in reflectance. Thus, the patterned portion 50 has a clear boundary.

In the shield package 1, the ratio of Sal of the non-patterned portion 60 to Sal of the patterned portion 50 is as follows: (Sal of the non-patterned portion)/(Sal of the patterned portion)>4.0.

When the Sal ratio is in the above range, the patterned portion includes a larger number of sharp irregularities than the non-patterned portion. Presumably, this prevents or reduces reflection of light. Thus, the light and dark contrast between the patterned portion and the non-patterned portion is clear, further improving the distinctiveness of the patterned portion.

Sal of the non-patterned portion 60 and the patterned portion 50 can be measured using a confocal microscope (OPTELICS HYBRID available from Lasertec Corporation) in accordance with ISO 25178.

These parameters can be controlled by adjusting the width and depth of each groove 21, interval between the grooves 21, composition of the conductive coating material used to form the shield layer, and the like.

In the shield package 1, the width W of each groove (the distance indicated by "W" in FIG. 1(c)) is preferably 5 to 100 μm.

When the width W of each groove 21 is in the above range, the difference in brightness is clear between the patterned portion 50 drawn with lines on the surface of the shield layer 40 and the non-patterned portion 60.

When the width W of each groove 21 is less than 5 μm, the depressions 41 are less likely to be formed on the surface of the shield layer 40. As a result, the difference in brightness is small between the patterned portion 50 on the surface of the shield layer 40 and the non-patterned portion 60, making the patterned portion 50 less distinguishable. In addition, the leveling effect of the conductive coating material makes the patterned portion less recognizable by optical means such as a reader.

When the width W of each groove 21 is more than 100 μm, the width of each depression 41 formed on the surface of the shield layer 40 is large, and there are fewer depressions 41 per unit area. Thus, there are fewer depressions 41 to draw the patterned portion 50.

As a result, the difference in brightness is small between the patterned portion 50 on the surface of the shield layer 40 and the other portion, making the patterned portion 50 less distinguishable.

In the shield package 1, the depth D of each groove 21 (the distance indicated by "D" in FIG. 1(c)) is preferably 5 µm or more, more preferably 20 µm or more.

When the depth D of each groove 21 is 5 µm or more, the depressions 41 are clearly formed on the surface of the shield layer 40. Thus, the difference in brightness is clear between the patterned portion 50 drawn with lines on the surface of the shield layer 40 and the non-patterned portion 60.

In the shield package of the present invention, the grooves may have any form as long as the depressions can be formed on the surface of the shield layer.

For example, the grooves each may have a line shape or dot shape.

In particular, the line-shaped linear grooves are easily formed by laser marking.

Here, the shape of the grooves in the shield package of the present invention is described with reference to the drawings.

FIGS. 3(a) and 3(b) are top views each schematically showing an example of the shape of the grooves formed in the sealing material of the shield package of the present invention.

Grooves 121 are formed linearly and parallel to each other in a sealing material 120 shown in FIG. 3(a).

Each interval I (the distance indicated by "I" in FIG. 3(a)) between adjacent grooves 121 is equidistant.

The linear and parallel grooves 121 are simple shapes so that they can be efficiently formed.

In the sealing material 120, preferably, the grooves 121 adjacent to each other are arranged at an interval of 10 to 100 µm.

When each interval I between adjacent grooves 121 is in the above range, the difference in brightness is clear between the patterned portion drawn with lines on the surface of the shield layer and the non-patterned portion.

When each interval between adjacent grooves is less than 10 µm, many grooves need to be formed, so that it takes time to form the grooves and it is thus inefficient. In addition, the leveling effect of the conductive coating material makes the patterned portion less recognizable by optical means such as a reader.

When each interval between adjacent grooves is more than 100 µm, the intervals between the depressions formed on the surface of the shield layer are large, and there are fewer depressions per unit area. Thus, there are fewer depressions to draw the patterned portion.

As a result, the difference in brightness is small between the patterned portion on the surface of the shield layer and the non-patterned portion, making the patterned portion less distinguishable.

While each interval I between the adjacent grooves 121 is equidistant in FIG. 3(a), in the shield package of the present invention, each interval between adjacent grooves may not necessarily be equidistant.

Grooves 221 are formed in a grid shape in a sealing material 220 shown in FIG. 3(b).

Cells of the grid formed by the grooves 221 have the same shape.

The grid-shaped grooves 221 can be easily formed by laser marking crosswise.

In the sealing material 220, the width S (the distance indicated by "S" in FIG. 3(b)) of each cell 225 of the grid formed by the grooves 221 is preferably 10 to 100 µm.

When the width S of each cell 225 is in the above range, the difference in brightness is clear between the patterned portion drawn with lines on the surface of the shield layer and the non-patterned portion.

When the width of each cell of the grid formed by the grooves is less than 10 µm, many grooves need to be formed, so that it takes time to form the grooves and it is thus inefficient. In addition, the leveling effect of the conductive coating material makes the patterned portion less recognizable by optical means such as a reader.

When the width of each cell of the grid formed by the grooves is more than 100 µm, the intervals between the depressions formed on the surface of the shield layer are large, and there are fewer depressions per unit area. Thus, there are fewer depressions to draw the patterned portion.

As a result, the difference in brightness is small between the patterned portion on the surface of the shield layer and the non-patterned portion, making the patterned portion less distinguishable.

While the cells of the grid formed by the grooves 221 have the same square shape in FIG. 3(b), in the shield package of the present invention, the cells of the grid formed by the grooves may have different shapes or may have rectangular shapes.

In the shield package of the present invention, the electronic component is not limited and may be a conventional electronic component for wireless communication.

In the shield package of the present invention, the material of the sealing material that seals the electronic component is not limited, and it may be a common resin material.

Examples of the resin material include epoxy resins, phenolic resins, silicone resins, unsaturated polyester resins, melamine resins, urea resins, diallyl phthalate resins, polyimide resins, and polyphenylene sulfide resins.

The resin material may be formed from at least one selected from thermosetting resins, thermoplastic resins, and active energy ray curable resins, but is preferably formed from a thermosetting resin or an active energy ray curable resin in view of heat resistance.

In the shield package of the present invention, the shield layer is not limited and may be formed from a known conductive coating material.

The shield layer may be formed from one or more resins serving as binder components and conductive particles.

Examples of the binder components forming the shield layer include epoxy resins, alkyd resins, melamine resins, xylene resins, and (meth)acrylate compounds.

Examples of the epoxy resins include bisphenol type epoxy resins such as bisphenol A type epoxy resins, bisphenol F type epoxy resins, and bisphenol S type epoxy resins; glycidyl ether epoxy resins such as spiro ring epoxy resins, naphthalene epoxy resins, biphenyl epoxy resins, terpene epoxy resins, tris(glycidyloxyphenyl)methane, and tetrakis (glycidyloxyphenyl)ethane; glycidylamine epoxy resins such as tetraglycidyldiaminophenylmethane; tetrabrom bisphenol A type epoxy resin; novolac epoxy resins such as cresol novolac epoxy resins, phenol novolac epoxy resins, α-naphthol novolac epoxy resins, and brominated phenol novolac epoxy resins; and rubber modified epoxy resins.

The (meth)acrylate compounds refer to acrylate compounds or methacrylate compounds, and may be any compounds having an acryloyl group or a methacryloyl group. Examples of the (meth)acrylate compounds include isoamyl acrylate, neopentyl glycol diacrylate, trimethylolpropane triacrylate, ditrimethylolpropane tetraacrylate, 2-hydroxy-3-acryloyloxypropyl methacrylate, phenyl glycidyl ether acrylate hexamethylene diisocyanate urethane prepolymer, adducts of acrylic acid with bisphenol A diglycidyl ether, ethylene glycol dimethacrylate, and diethylene glycol dimethacrylate.

Examples of the conductive particles forming the shield layer include metal particles such as copper particles, silver particles, nickel particles, silver-coated copper particles, gold-coated copper particles, silver-coated nickel particles, and gold-coated nickel particles.

The shape of the metal particles is not limited, and may be spherical, flaky (scaly), branching, or fibrous.

The spherical particles include not only substantially true spherical particles (atomized powder) but also substantially spherical particles such as substantially polyhedral spherical particles (reduced powder) and irregular shaped particles (electrolyte powder).

The shield layer is formed from a cured product of a conductive coating material containing a curing agent, and thus may contain a component derived from the curing agent.

The shield layer may contain known additives such as defoamers, thickeners, adhesives, fillers, flame retardants, and colorants, if necessary.

In the shield package of the present invention, the patterned portion on the surface of the shield layer may be a simple pattern or one that indicates distinctive information such as a letter or a mark.

When the patterned portion includes letters, the letters may show a product model number, a lot number, a manufacturing date/time, or the like. When the patterned portion includes letters, preferably, the letters are visible.

The distinctive information may be a two-dimensional code, for example.

When the patterned portion is a two-dimensional code, preferably, the patterned portion is readable with a reader (e.g., Honeywell Barcode Scanner Xenon 1902 Series).

In the shield package 1, the multiple grooves 21 are formed on the surface of the sealing material 20, whereby the patterned portion 50 is formed on the surface of the shield layer 40.

Yet, in the shield package of the present invention, no grooves may be formed on the surface of the sealing material, as long as the ratio of Sal of the non-patterned portion to Sal of the patterned portion is as follows: (Sal of the non-patterned portion)/(Sal of the patterned portion)>4.0.

For example, the patterned portion may be formed by forming multiple protrusions and/or multiple depressions on the surface of the shield layer. The multiple protrusions or multiple depressions may be randomly or regularly arranged. The multiple protrusions or multiple depressions may be drawn with lines and/or dots.

The method of forming multiple protrusions and/or depressions on the surface of the shield layer is not limited, and any conventional method may be used, such as a method in which the surface of the shield layer is processed by embossing, sandblasting, or the like, or a method in which particles are added to a conductive coating material used to form the shield layer.

Alternatively, a package in which an electronic component is coated with a sealing material may be processed by embossing, sandblasting, or the like, or particles are added to such a package so as to form multiple protrusions and/or depressions on the surface of the package; and subsequently, a conductive coating material may be applied to form the shield layer so as to form multiple protrusions and/or depressions on the surface of the shield layer.

Next, an example of the method of producing a shield package of the present invention is described.

The method of producing a shield package of the present invention includes: (1) a package preparing step; (2) an intended drawing area determining step; (3) a drawing area forming step; and (4) a shield layer forming step.

Each step is described below with reference to the drawings.

FIG. 4 is a view schematically showing an example of the package preparing step of the method of producing a shield package of the present invention.

Figure 5:
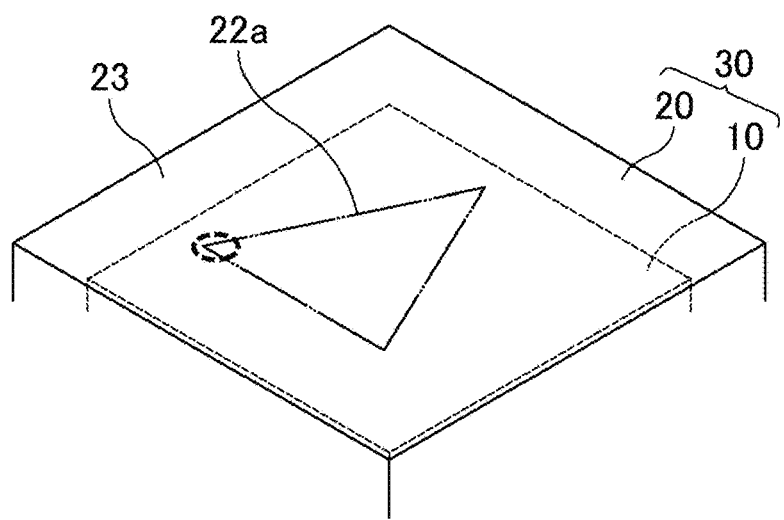
FIG. 5 is a view schematically showing an example of an intended drawing area determining step of the method of producing a shield package of the present invention.

FIG. 5 is a view schematically showing an example of the intended drawing area determining step of the method of producing a shield package of the present invention.

Figure 6:
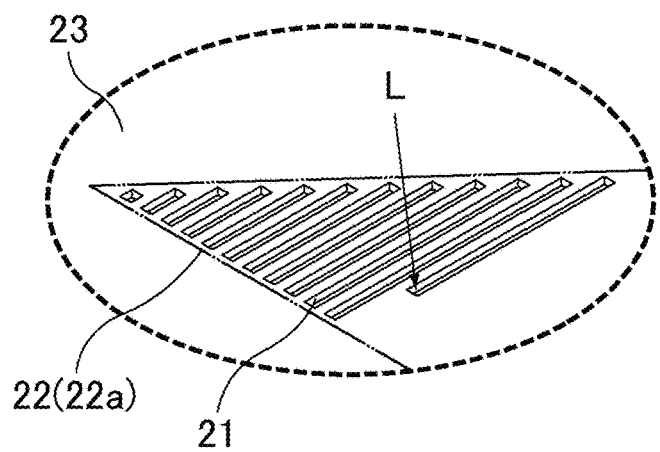
FIG. 6 is an enlarged view of a portion surrounded by a dashed line in FIG. 5, and is a view schematically showing an example of a drawing area forming step of the method of producing a shield package of the present invention.

FIG. 6 is an enlarged view of a portion surrounded by a dashed line in FIG. 5, and is a view schematically showing an example of the drawing area forming step of the method of producing a shield package of the present invention.

Figure 7:
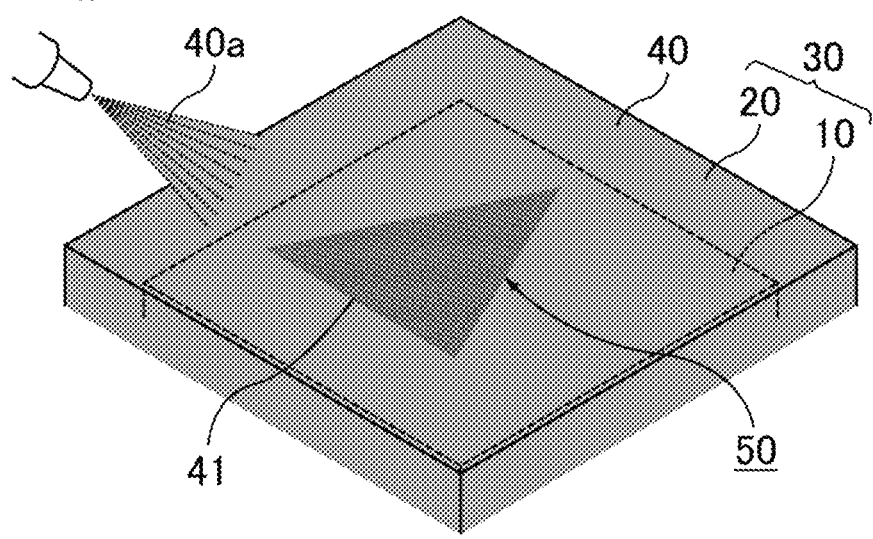
FIG. 7 is a view schematically showing an example of a shield layer forming step of the method of producing a shield package of the present invention.

FIG. 7 is a view schematically showing an example of the shield layer forming step of the method of producing a shield package of the present invention.

(1) Package Preparing Step

First, as shown in FIG. 4, the package 30 in which the electronic component 10 is sealed with the sealing material 20 is prepared.

The type of the electronic component and the material of the sealing material have been already described, and descriptions thereof are thus omitted.

(2) Intended Drawing Area Determining Step

Next, as shown in FIG. 5, an intended drawing area 22a and the non-drawing area 23 other than the intended drawing area 22a are determined on the surface of the sealing material 20.

(3) Drawing Area Forming Step

Next, as shown in FIG. 6, a laser beam L is applied to the intended drawing area 22a to form the multiple line-shaped grooves 21 in such a manner that these line-shaped linear grooves 21 are aggregated to draw the drawing area 22 with lines.

While the drawing area 22 is drawn with lines using the line-shaped grooves 21 in FIG. 6, dot-like grooves may be formed to draw the drawing area with dots in the method of producing a shield package of the present invention.

The width and depth of each groove to be formed in the intended drawing area can be controlled by adjusting the output and moving speed of the laser.

During this process, the width and depth of each groove, interval between the grooves, composition of the conductive coating material to be applied to the surface of the package are controlled so that the ratio of Sal of the non-patterned portion to Sal of the patterned portion is as follows, in the shield layer to be formed in the subsequent step: (Sal of the non-patterned portion)/(Sal of the patterned portion)>4.0.

(4) Shield Layer Forming Step

Next, as shown in FIG. 7, a conductive coating material 40a is applied to the surface of the sealing material 20, and the conductive coating material is then cured to form the shield layer 40.

In this step, the line-shaped depressions 41 originating from the line-shaped grooves 21 are formed in such a manner that these depressions 41 are aggregated to draw the patterned portion 50 with lines.

In FIG. 7, the line-shaped depressions 41 originating from the line-shaped grooves 21 are formed. As described above, in the method of producing a shield package of the present invention, dot-like grooves may be formed in the drawing area forming step. In this case, dot-like depressions are formed so that the patterned portion is drawn with dots by the dot-like depressions.

In this step, the method of applying the conductive coating material is not limited. Examples include spraying, screen printing, and dipping. Of these, spraying is preferred because a shield layer having a uniform thickness is easily obtained.

The thickness of the shield layer can be adjusted by controlling the spraying time and the like to adjust the amount of the conductive coating material to be applied.

The conductive coating material used in this step is described.

The conductive coating material contains binder components, conductive particles, and a curing agent.

Preferred types of the binder components and the conductive particles are the same as the preferred types of the binder components and the conductive particles forming the shield layer, and descriptions thereof are thus omitted.

The amount of the conductive particles is preferably 500 to 1800 parts by weight, more preferably 550 to 1800 parts by weight, relative to the total 100 parts by weight of the binder components.

Examples of the curing agent include phenolic curing agents, imidazole curing agents, amine curing agents, cationic curing agents, and radical curing agents.

Examples of the phenolic curing agents include novolac phenol and naphthol compounds.

Examples of the imidazole curing agents include imidazole, 2-undecylimidazole, 2-heptadecylimidazole, 2-methylimidazole, 2-ethylimidazole, 2-phenylimidazole, 2-ethyl-4-methyl-imidazole, 1-cyanoethyl-2-undecylimidazole, and 2-phenylimidazole.

Examples of the cationic curing agents include amine salts of boron trifluoride and onium compounds such as p-methoxybenzene diazonium hexafluorophosphate, diphenyliodonium hexafluorophosphate, triphenylsulfonium, tetra-n-butylphosphonium tetraphenylborate, and tetra-n-butylphosphonium-o, o-diethylphosphorodithioate.

Examples of the radical curing agents (polymerization initiators) include di-cumyl peroxide, t-butyl cumyl peroxide, t-butyl hydroperoxide, and cumene hydroperoxide.

The amount of the curing agent is different depending on the type of the curing agent, but usually, it is preferably 0.3 to 40 parts by weight, more preferably 0.5 to 35 parts by weight, relative to the total 100 parts by weight of the binder components.

The conductive coating material may contain a solvent such as methyl ethyl ketone, if necessary.

Preferably, the conductive coating material has a viscosity of 10 to 5000 mPa·s.

A conductive coating material having a viscosity of less than 10 mPa·s is too low in viscosity and thus tends to fill the irregularities.

A conductive coating material having a viscosity of more than 5000 mPa·s is too high in viscosity and thus forms a coating film with high surface roughness. This tends to result in poor shielding properties and poor appearance.

The method of curing the conductive coating material may be a known curing method, such as a method of curing the binder component by heating or a method of applying activation energy rays to cure the binder component. Curing conditions can be suitably set according to the type and amount of the curing agent in the binder component.

Second Embodiment

A shield package according to a second embodiment of the present invention is the same as the shield package according to the first embodiment of the present invention, except that the ratio of Smr1 of the non-patterned portion to Smr1 of the patterned portion is as follows: (Smr1 of non-patterned portion)/(Smr1 of patterned portion)>1.0, whereas in the shield package according to the first embodiment, the ratio of Sal of the non-patterned portion to Sal of the patterned portion of is as follows: (Sal of the non-patterned portion)/(Sal of the patterned portion)>4.0.

When the Smr1 ratio is in the above range, the patterned portion includes a larger number of sharp irregularities than the non-patterned portion. Presumably, this prevents or reduces reflection of light. Thus, the light and dark contrast between the patterned portion and the non-patterned portion is clear, further improving the distinctiveness of the patterned portion.

Smr1 of the non-patterned portion and the patterned portion can be measured using a confocal microscope (OPTELICS HYBRID available from Lasertec Corporation) in accordance with ISO 25178.

Third Embodiment

A shield package according to a third embodiment of the present invention is the same as the shield package according to the first embodiment of the present invention, except the ratio of Ssk of the non-patterned portion to Ssk of the patterned portion is as follows: Ssk of non-patterned portion)/(Ssk of patterned portion)<5.0, whereas in the shield package according to the first embodiment, the ratio of Sal of the non-patterned portion to Sal of the patterned portion is as follows: (Sal of the non-patterned portion)/(Sal of the patterned portion)>4.0.

When the Ssk ratio is in the above range, the patterned portion includes a larger number of fine protrusions than the non-patterned portion. Presumably, this prevents or reduces reflection of light. Thus, the light and dark contrast between the patterned portion and the non-patterned portion is clear, further improving the distinctiveness of the patterned portion.

Ssk of the non-patterned portion and the patterned portion can be measured using a confocal microscope (OPTELICS HYBRID available from Lasertec Corporation) in accordance with ISO 25178.

Fourth Embodiment

A shield package according to a fourth embodiment of the present invention is the same as the shield package according to the first embodiment of the present invention, except that the ratio of Rvk of the non-patterned portion to Rvk of the patterned portion is as follows: (Rvk of the non-patterned portion)/(Rvk of the patterned portion)<0.4, whereas in the shield package according to the first embodiment, the ratio of Sal of the non-patterned portion to Sal of the patterned portion is as follows: (Sal of the non-patterned portion)/(Sal of the patterned portion)>4.0.

When the Rvk ratio is in the above range, valleys on the surface of the patterned portion are sufficiently deeper than valleys on the surface of the non-patterned portion. Presumably, this prevents or reduces reflection of light. Thus, the light and dark contrast between the patterned portion and the non-patterned portion is clear, further improving the distinctiveness of the patterned portion.

Rvk of the non-patterned portion and the patterned portion can be measured using a confocal microscope (OPTEL- ICS HYBRID available from Lasertec Corporation) in accordance with JIS B 0601:2001.

Other Embodiments

The shield packages according to the first to fourth embodiments of the present invention satisfy the following first to fourth conditions, respectively: "the ratio of Sal of the non-patterned portion to Sal of the patterned portion is as follows: (Sal of the non-patterned portion)/(Sal of the patterned portion)>4.0"; "the ratio of Smr1 of the non-patterned portion to Smr1 of the patterned portion is as follows: (Smr1 of non-patterned portion)/(Smr1 of patterned portion)>1.0"; "the ratio of Ssk of the non-patterned portion to Ssk of the patterned portion is as follows: (Ssk of non-patterned portion)/(Ssk of patterned portion)<5.0"; and "the ratio of Rvk of the non-patterned portion to Rvk of the patterned portion is as follows: (Rvk of the non-patterned portion)/(Rvk of the patterned portion)<0.4".

The shield package of the present invention may be a shield package that simultaneously satisfies two of the following conditions: "the ratio of Sal of the non-patterned portion to Sal of the patterned portion is as follows: (Sal of the non-patterned portion)/(Sal of the patterned portion)>4.0"; "the ratio of Smr1 of the non-patterned portion to Smr1 of the patterned portion is as follows: (Smr1 of non-patterned portion)/(Smr1 of patterned portion)>1.0"; "the ratio of Ssk of the non-patterned portion to Ssk of the patterned portion is as follows: (Ssk of non-patterned portion)/(Ssk of patterned portion)<5.0"; and "the ratio of Rvk of the non-patterned portion to Rvk of the patterned portion is as follows: (Rvk of the non-patterned portion)/(Rvk of the patterned portion)<0.4".

In particular, since Sal, Smr1, and Ssk are parameters that represent three-dimensional shapes, the shield package of the present invention may simultaneously satisfy these parameters.

EXAMPLES

The present invention is described in detail below based on examples, but the present invention is not limited to these examples.

Example 1

(1) Package Preparing Step

A model package having a size of 1 cm (length)×1 cm (width) was prepared in which a model IC was sealed with a sealing material formed from a thermosetting epoxy resin.

(2) Intended Drawing Area Determining Step

An intended drawing area for a two-dimensional code and a non-drawing area other than the intended drawing area were determined on a surface of the sealing material of the model package.

(3) Drawing Area Forming Step

Next, using a laser marker ("LodeStone" available from ESI), multiple grooves were formed in the intended drawing area to form a drawing area with a laser output of 0.3 W and a laser engraving width of 4.0 μm at a laser moving speed of 400 mm/s.

The grooves were formed linearly and parallel to each other, with each interval between adjacent grooves being equidistant.

Each groove had a width of 10 μm and a depth of 40 μm. Each interval between adjacent grooves was 15 μm.

(4) Shield Layer Forming Step

First, a conductive coating material with the following composition was prepared.

<Composition of Conductive Coating Material>
Binder Components (Epoxy Resin)
Product name "JER157S70" available from Mitsubishi Chemical Corporation, 20 parts by weight
Product name "EP-3905S" available from ADEKA Corporation, 30 parts by weight
Product name "EP-4400" available from ADEKA Corporation, 50 parts by weight
Conductive Particles
Silver-coated copper alloy particles (average particle size: 5 μm; flaky; aspect ratio: 2 to 10), 1000 parts by weight
Curing Agents
Phenolic novolac (product name "Tamanol 758" available from Arakawa Chemical Industries, Ltd.), 15 parts by weight 2-Methylimidazole (product name "2MZ-H" available from Shikoku Chemicals Corporation), 5 parts by weight
Solvent
1-Methoxy-2-propanol, 24 wt %

Next, the conductive coating material was applied by spraying under the following conditions, whereby a 7-μm thick shield layer was formed on the surface of the sealing material of the model package.

<Spray conditions>SL-940E available from Nordson Asymtek Paste extrusion pressure: 2.8 Psi
Asist air (Atomized air): 5 Psi
Package surface temperature: 22° C.
Distance between package surface and nozzle: about 15 cm
Spray head moving pitch: 5 mm
Spray head moving speed: 500 mm/sec
Number of times to spray: 4 times
Curing conditions: 20 minutes of standing in dryer at 160° C.

By these steps, a model shield package according to Example 1 was produced in which the multiple depressions originating from the grooves were formed on the shield layer, and the two-dimensional code was drawn with lines by aggregation of the depressions.

FIG. 8(*a*) is a photograph of the shield package according to Example 1. FIG. 8(*b*) is an enlarged photograph of the patterned portion of the shield package shown in FIG. 8(*a*).

Examples 2 and 3 and Comparative Examples 1 and 2

Model shield packages according to Examples 2 and 3 and Comparative Examples 1 and 2 were each produced as in Example 1, except that in "(3) Drawing area forming step", each interval between adjacent grooves was changed as shown in Table 1.

(Measurement of Parameters of Patterned Portion and Non-Patterned Portion)

For each of the shield packages of the examples and the comparative examples, each parameter of the patterned portion and the non-patterned portion of the shield layer was measured using a confocal microscope (OPTELICS HYBRID 20×objective lens available from Lasertec Corporation). Sal, Smr1, and Ssk were measured in accordance with ISO 25178, and Rvk was measured in accordance with JIS B 0601:2001. For each of Sal, Smr1, Ssk, and Rvk, values were measured at three sites randomly selected from each of the patterned portion and the non-patterned portion, and the measurements were averaged. For each of Sal, Smr1, and Ssk, the measurement area was 200 μm (length)×200 μm (width). For Rvk, the measurement length was 200 μm. Table 1 shows the results.

TABLE 1

|  |  | Ex. 1 | Ex. 2 | Ex. 3 | Comp. Ex. 1 | Comp. Ex. 2 |
|---|---|---|---|---|---|---|
| Width of grooves (μm) | | 10 | 10 | 10 | 10 | 10 |
| Depth of grooves (μm) | | 40 | 40 | 40 | 40 | 40 |
| Interval between adjacent grooves (μm) | | 15 | 20 | 30 | 4 | 10 |
| Sal | Patterned portion | 8.1 | 8.7 | 11.7 | 24.8 | 14.3 |
| | Non-patterned portion | 58.2 | 67.6 | 49.5 | 42.6 | 38.7 |
| | Non-patterned portion/Patterned portion | 7.2 | 7.8 | 4.2 | 1.7 | 2.7 |
| Smr1 | Patterned portion | 7.4 | 4.6 | 5.2 | 12.8 | 10.0 |
| | Non-patterned portion | 11.3 | 5.9 | 9.0 | 8.7 | 7.9 |
| | Non-patterned portion/Patterned portion | 1.5 | 1.3 | 1.7 | 0.7 | 0.8 |
| Ssk | Patterned portion | −0.2 | −0.4 | −0.8 | 0.0 | 0.0 |
| | Non-patterned portion | 0.0 | −0.4 | −0.3 | −0.2 | −0.4 |
| | Non-patterned portion/Patterned portion | 0.0 | 1.0 | 0.4 | 14.0 | 33.2 |
| Rvk | Patterned portion | 3.4 | 5.1 | 6.7 | 2.4 | 4.1 |
| | Non-patterned portion | 1.3 | 1.8 | 1.5 | 2.2 | 1.8 |
| | Non-patterned portion/Patterned portion | 0.4 | 0.4 | 0.2 | 0.9 | 0.4 |
| Two-dimensional code reading test | | Readable | Readable | Readable | Unreadable | Unreadable |

FIG. 8 to FIG. 11 each show the ratio of each parameter of the patterned portion and non-patterned portion on the shield layer of each of the shield packages according to the examples and the comparative examples.

Figure 9:
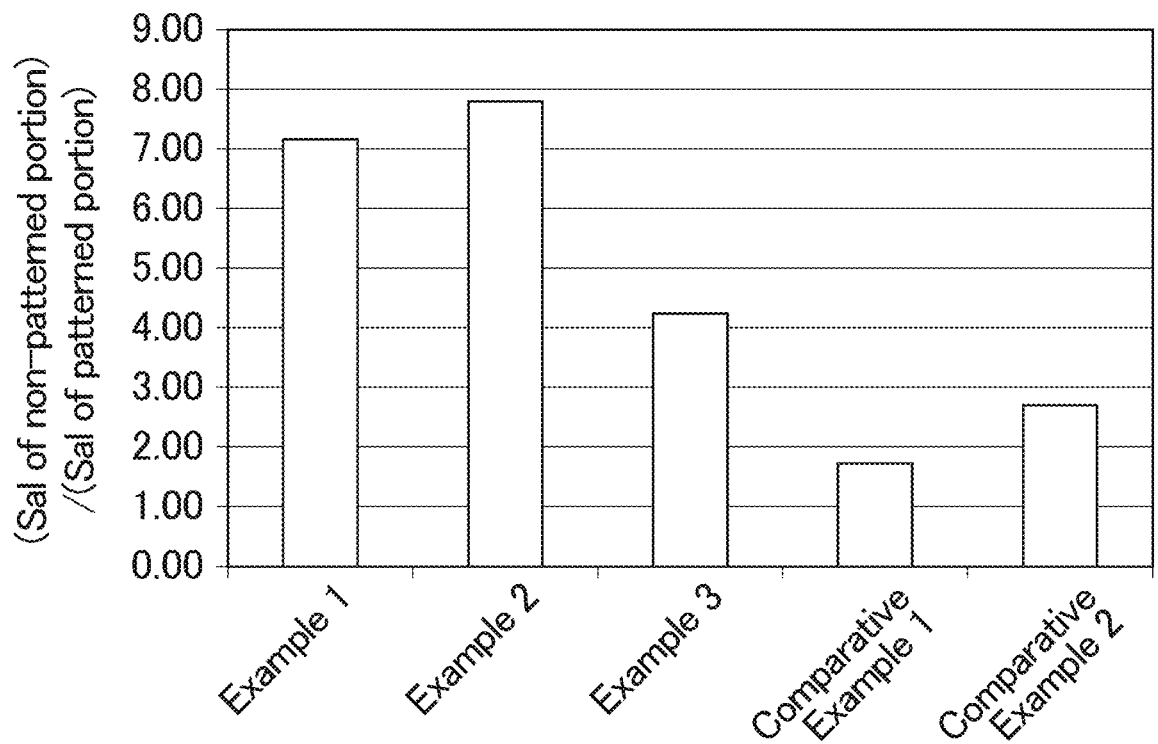
FIG. 9 is a graph showing a ratio of Sal of the non-patterned portion to Sal of the patterned portion ((Sal of non-patterned portion)/(Sal of patterned portion)) of each of the shield packages according to examples and comparative examples.

FIG. 9 is a graph showing the ratio of Sal of the non-patterned portion to Sal of the patterned portion ((Sal of the non-patterned portion)/(Sal of the patterned portion)) of each of the shield packages according to the examples and the comparative examples.

Figure 10:
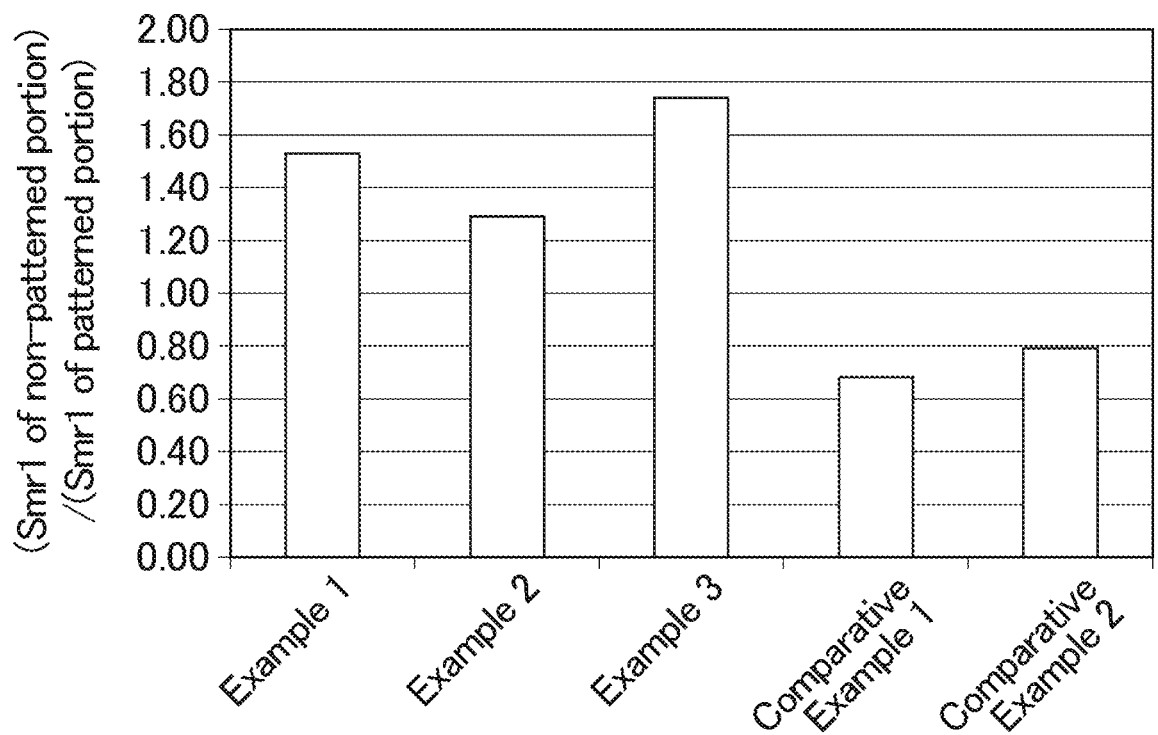
FIG. 10 is a graph showing a ratio of Smr1 of the non-patterned portion to Smr1 of the patterned portion ((Smr1 of non-patterned portion)/(Smr1 of patterned portion)) of each of the shield packages according to the examples and the comparative examples.

FIG. 10 is a graph showing the ratio of Smr1 of the non-patterned portion to Smr1 of the patterned portion ((Smr1 of non-patterned portion)/(Smr1 of patterned portion)) of each of the shield packages according to the examples and the comparative examples.

Figure 11:
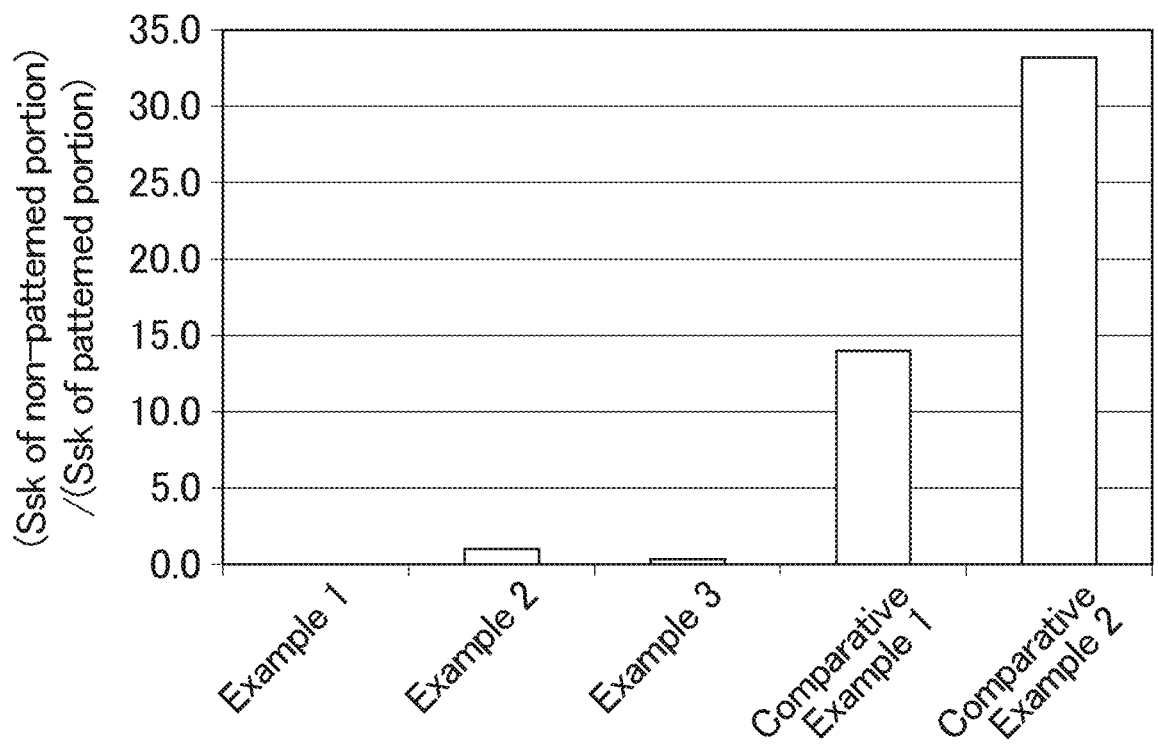
FIG. 11 is a graph showing a ratio of Ssk of the non-patterned portion to Ssk of the patterned portion ((Ssk of non-patterned portion)/(Ssk of patterned portion)) of each of the shield packages according to the examples and the comparative examples.

FIG. 11 is a graph showing the ratio of Ssk of the non-patterned portion to Ssk of the patterned portion ((Ssk of non-patterned portion)/(Ssk of patterned portion)) of each of the shield packages according to the examples and the comparative examples.

Figure 12:
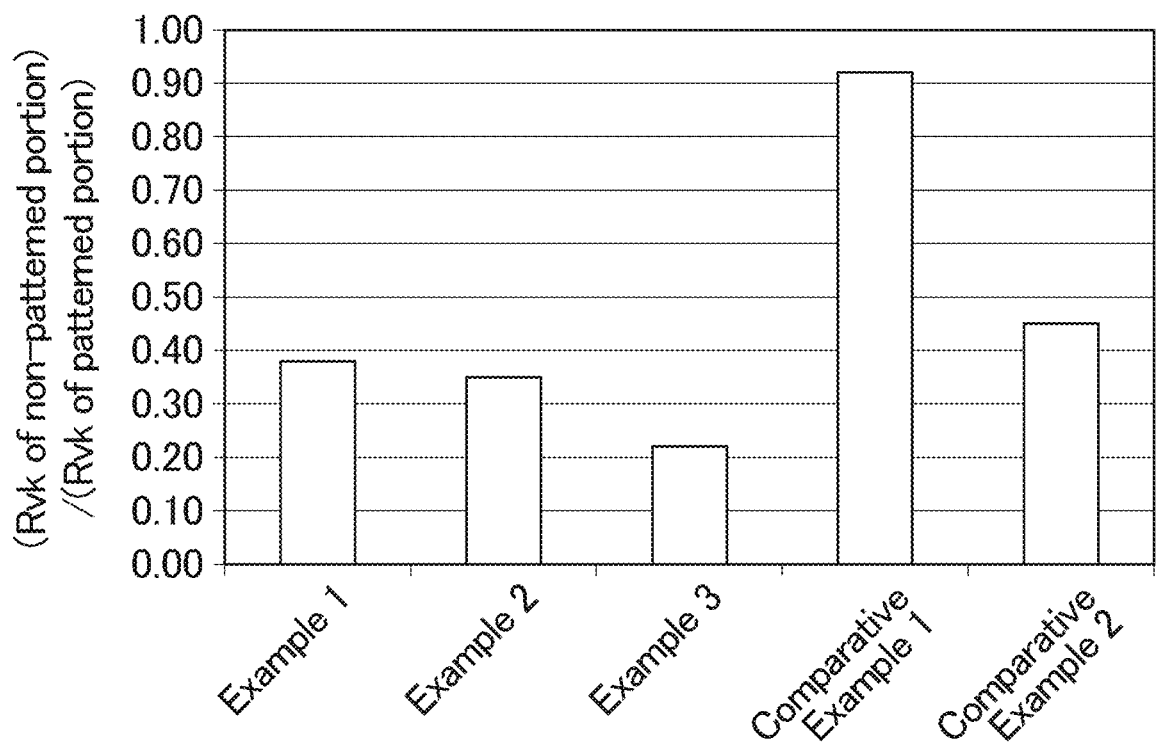
FIG. 12 is a graph showing a ratio of Rvk of the non-patterned portion to Rvk of the patterned portion ((Rvk of non-patterned portion)/(Rvk of patterned portion)) of each of the shield packages according to the examples and the comparative examples.

FIG. 12 is a graph showing the ratio of Rvk of the non-patterned portion to Rvk of the patterned portion ((Rvk of non-patterned portion)/(Rvk of patterned portion)) of each of the shield packages according to the examples and the comparative examples.

(Two-Dimensional Code Reading Test)

The two-dimensional codes formed on the model shield packages according to the examples and the comparative examples were subjected to a reading test using "Honeywell Barcode Scanner Xenon 1902 Series". Table 1 shows the results.

As shown in Table 1, the patterned portions on the shield packages according the examples were readable, but the patterned portions on the shield packages according the comparative examples were unreadable.

REFERENCE SIGNS LIST 1, 101, 201, 501 shield package
10, 110, 210, 510 electronic component
20, 120, 220, 520 sealing material
21, 121, 221, 521 groove
22, 522 drawing area
22a intended drawing area
23, 523 non-drawing area
30, 530 package
40, 540 shield layer
40a conductive coating material
41, 541 depression
50, 550 patterned portion
60 non-patterned portion
225 cell
525 fine irregularities

The invention claimed is:

1. A shield package comprising:
a package in which an electronic component is sealed with a sealing material; and
a shield layer covering the package,
wherein a surface of the shield layer includes a patterned portion and a non-patterned portion other than the patterned portion, and
a ratio of Sal of the non-patterned portion to Sal of the patterned portion is as follows: (Sal of non-patterned portion)/(Sal of patterned portion)>4.0, where Sal represents an autocorrelation length.

2. The shield package according to claim 1,
wherein a surface of the sealing material comprises a drawing area drawn with lines and/or dots by aggregation of multiple grooves, and a non-drawing area other than the drawing area,
multiple depressions originating from the grooves are formed on a surface of the shield layer on the drawing area, and
the depressions are aggregated to draw the patterned portion with lines and/or dots.

3. The shield package according to claim 2, wherein at least some of the multiple grooves each have a line shape.

4. The shield package according to claim 3, wherein at least some of the multiple grooves are formed linearly and in parallel to each other.

5. The shield package according to claim 4, wherein the grooves adjacent to each other are arranged at an interval of 10 to 100 μm.

6. The shield package according to claim 2, wherein at least some of the multiple grooves are formed in a grid shape.

7. The shield package according to claim 6, wherein each cell of the grid formed by the grooves has a width of 10 to 100 μm.

8. The shield package according to claim 2, wherein each groove has a width of 5 to 100 μm.

9. The shield package according to claim 2, wherein each groove has a depth of 5 μm or more.

10. The shield package according to claim 1, wherein the patterned portion is a two-dimensional code.

11. A shield package comprising:
a package in which an electronic component is sealed with a sealing material; and
a shield layer covering the package,
wherein a surface of the shield layer includes a patterned portion and a non-patterned portion other than the patterned portion, and
a ratio of Smr1 of the non-patterned portion to Smr1 of the patterned portion is as follows: (Smr1 of non-patterned portion)/(Smr1 of patterned portion)>1.0, where Smr1 represents a ratio of the area of the material at the intersection line which separates the protruding hills from the core surface to the evaluation area.

12. A shield package comprising:
a package in which an electronic component is sealed with a sealing material; and
a shield layer covering the package,
wherein a surface of the shield layer includes a patterned portion and a non-patterned portion other than the patterned portion, and
a ratio of Ssk of the non-patterned portion to Ssk of the patterned portion is as follows: (Ssk of non-patterned portion)/(Ssk of patterned portion)<5.0, where Ssk represents skewness.

\* \* \* \* \*